United States Patent [19]
Arimoto

[11] Patent Number: 5,612,919
[45] Date of Patent: Mar. 18, 1997

[54] METHOD OF TESTING AN OPERATION OF A SEMICONDUCTOR MEMORY DEVICE AND SEMICONDUCTOR MEMORY DEVICE WHICH CAN BE SUBJECTED TO SUCH AN OPERATION TEST

[75] Inventor: Kazutami Arimoto, Hyogo, Japan

[73] Assignee: Mitsubishi Denki Kabushiki Kaisha, Tokyo, Japan

[21] Appl. No.: 587,683

[22] Filed: Jan. 17, 1996

[30]  Foreign Application Priority Data

Jan. 18, 1995  [JP]  Japan .................................. 7-006005

[51] Int. Cl.$^6$ ................................................. G11C 7/00
[52] U.S. Cl. ............................ 365/201; 365/63; 365/149
[58] Field of Search ................................. 365/201, 149, 365/63, 202

[56] References Cited

U.S. PATENT DOCUMENTS 5,359,566  10/1994  Furuyama ............................... 365/149
5,500,821   3/1996  Tanaka ................................... 365/201

FOREIGN PATENT DOCUMENTS 6-349267  12/1994  Japan .

OTHER PUBLICATIONS

"A 34ns 256Mb DRAM with Boosted Sense–Ground Scheme" *IEEE* International Solid–State Circuits Conference, 1994, pp. 140–141.

"A 34ns 256Mb DRAM with Boosted Sense–Ground Scheme" *ISSCC* Slide Supplemental, 1994, pp. 106–107.

"Memory Array Architecture and Decoding Scheme for 3 V Only Sector Erasable DINOR Flash Memory" *IEEE*, 1994, pp. 454–458.

*Primary Examiner*—David C. Nelms
*Assistant Examiner*—Vu A. Le
*Attorney, Agent, or Firm*—Lowe, Price, LeBlanc & Becker

[57]  ABSTRACT

A semiconductor memory device includes a main bit line; a plurality of sub-bit line pairs provided corresponding to the main bit line pair; a plurality of transistor pairs provided respectively corresponding to the plurality of sub-bit line pairs, each transistor pair being responsive to a prescribed selection signal for connecting one sub-bit line of a corresponding sub-bit line pair to one main bit line of the main bit line pair and connecting the other sub-bit line thereof to the other main bit line thereof; a plurality of word lines; a plurality of memory cells connected to sub-bit line pairs and word lines; and a selecting circuit for selecting one transistor pair out of the plurality of transistor pairs and applying the selection signal to the selected transistor pair to render the transistor pair conductive, as well as selecting at least another transistor pair out of the plurality of transistor pairs in response to the test enable signal and applying the selection signal to the selected transistor pair to render the transistor pair conductive. Thus, the total parasitic capacitance of the main and the sub-bit lines increases, so that an accelerated test of a read operation margin can be carried out.

8 Claims, 17 Drawing Sheets

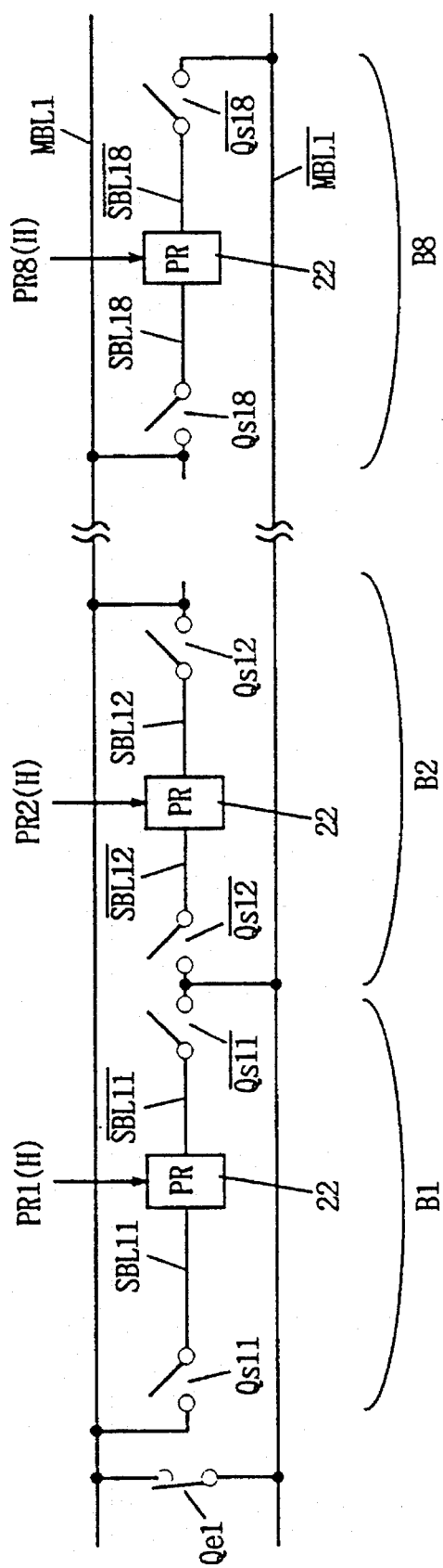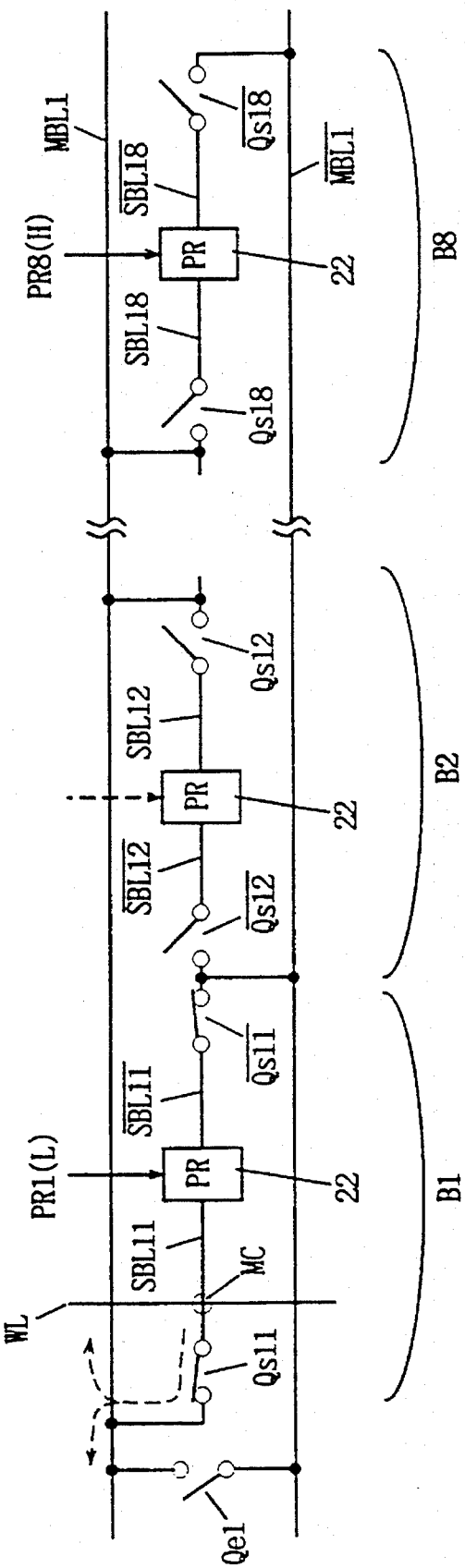

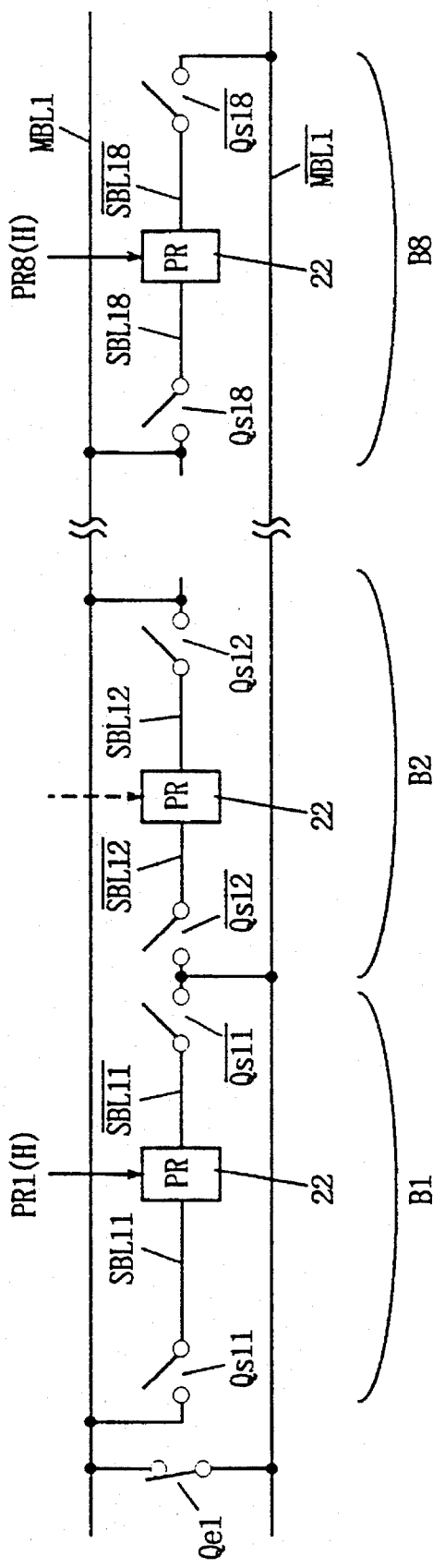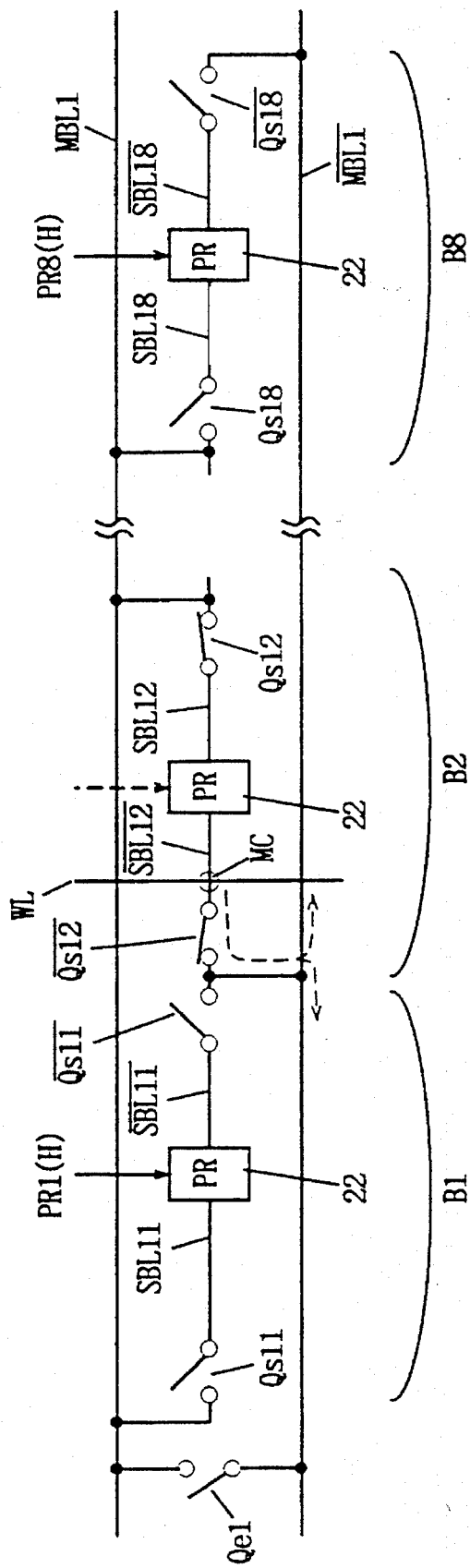

METHOD OF TESTING AN OPERATION OF A SEMICONDUCTOR MEMORY DEVICE AND SEMICONDUCTOR MEMORY DEVICE WHICH CAN BE SUBJECTED TO SUCH AN OPERATION TEST

BACKGROUND OF THE INVENTION

1. Field of the Invention

The present invention relates to a method of testing an operation of a semiconductor memory device and a semiconductor memory device which can be subjected to such an operation test, and more particularly, to a method of acceleratedly testing a read operation of a dynamic random access memory (hereinafter referred to as "DRAM") having a hierarchical bit line (divided bit line) structure.

2. Description of the Background Art

A DRAM having a so-called hierarchical bit line structure has been proposed for the purpose of implementing large storage capacity with small chip area. In this DRAM, a plurality of sub-bit line pairs are provided corresponding to a single main bit line pair, and each sub-bit line pair is connected through two selection transistors to the main bit line. A semiconductor memory device with a hierarchical bit line structure including a main bit line pair having at most ¼ parasitic capacitance per unit length of a sub-bit line pair has been already disclosed in Japanese Patent Laying-Open No. 6-349267.

With increase in capacity of a semiconductor memory device, time required for an operation test thereof increases. Therefore, an accelerated testing method which can be carried out reliably for a short time is becoming important. In particular, since a semiconductor memory device with a hierarchical bit line structure generally has large storage capacity, it conventionally takes a lot of time to carry out various tests of a read operation margin, a read noise margin, a sensing operation margin or the like thereof.

SUMMARY OF THE INVENTION

It is an object of the present invention to provide a semiconductor memory device which can be subjected to a reliable test.

It is another object of the present invention to provide a semiconductor memory device having superior ability to detect defects.

It is a further object of the present invention to provide a semiconductor memory device which can be subjected to an accelerated test.

It is a still further object of the present invention to provide a semiconductor memory device which can be subjected to an accelerated test of a read operation margin thereof.

It is a still further object of the present invention to provide a semiconductor memory device which can be subjected to an accelerated test of a read noise margin thereof.

It is a still further object of the present invention to provide a semiconductor memory device which can be subjected to an accelerated test of a sensing operation margin thereof.

A method of testing an operation in accordance with one aspect of the present invention is premised on a method of testing an operation of a semiconductor memory device including a main bit line pair, a plurality of sub-bit line pairs, a plurality of transistor pairs, a plurality of word lines and a plurality of memory cells. The plurality of sub bit line pairs are provided corresponding to the main bit line pair. The plurality of transistor pairs are provided corresponding to the plurality of sub-bit line pairs, respectively. Each of the plurality of transistor pairs connect one sub-bit line of a corresponding sub-bit line pair to one main bit line of the main bit line pair and connect the other sub-bit line to the other main bit line in response to a prescribed selection signal. The plurality of word lines are located across the plurality of sub-bit line pairs. The plurality of memory cells are provided corresponding to intersections of the plurality of sub-bit line pairs and the plurality of word lines, respectively. Each of the plurality of memory cells is connected to a corresponding sub-bit line pair and a corresponding word line. Furthermore, this method of testing an operation includes the steps of precharging at least two sub-bit line pairs out of the plurality of sub-bit line pairs; applying the selection signal to two transistor pairs respectively corresponding to these two sub-bit line pairs to render these two transistor pairs conductive; boosting one word line out of the plurality of word lines, which is located across one of the two sub-bit line pairs; and amplifying potential difference produced between the main bit line pair.

A semiconductor memory device in accordance with another aspect of the present invention can be subjected to an operation test in response to a prescribed test enable signal, and includes a main bit line pair, a plurality of sub-bit line pairs, a plurality of transistor pairs, a plurality of word lines, a plurality of memory cells, a first selecting circuit, and a second selecting circuit. The plurality of sub-bit line pairs are provided corresponding to the main bit line pair. The plurality of transistor pairs are provided corresponding to the plurality of sub-bit line pairs, respectively. Each of the plurality of transistor pairs connect one sub-bit line of a corresponding sub-bit line pair to one main bit line of the main bit line pair and connect the other sub-bit line to the other main bit line in response to a prescribed selection signal. The plurality of word lines are located across the plurality of sub-bit line pairs. The plurality of memory cells are provided corresponding to intersections of the plurality of sub-bit line pairs and the plurality of word lines, respectively. Each of the plurality of memory cells is connected to a corresponding sub-bit line pair and a corresponding word line. The first selecting circuit selects one transistor pair out of the plurality of transistor pairs, and applies the selection signal to the selected transistor pair to render the transistor pair conductive. The second selecting circuit selects at least another transistor pair out of the plurality of transistor pairs in response to the test enable signal, and applies the selection signal to the selected transistor pair to render the transistor pair conductive.

Accordingly, since at least two sub-bit line pairs are connected to the main bit line pair, the total parasitic capacitance of the main bit line pair and the sub-bit line pairs increases. Thus, read potential difference between the main bit line pair is reduced, and an accelerated test of a read operation margin can be performed as a result.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13A to 13D are circuit diagrams sequentially illustrating an operation of the DRAM in accordance with the third embodiment of the present invention.

DESCRIPTION OF THE PREFERRED EMBODIMENTS

Embodiments of the present invention will now be described in detail in conjunction with the accompanying drawings. It is noted that a like reference indicates a like or a corresponding portion in the figures.

[First Embodiment]

(1) Arrangement

Figure 1:
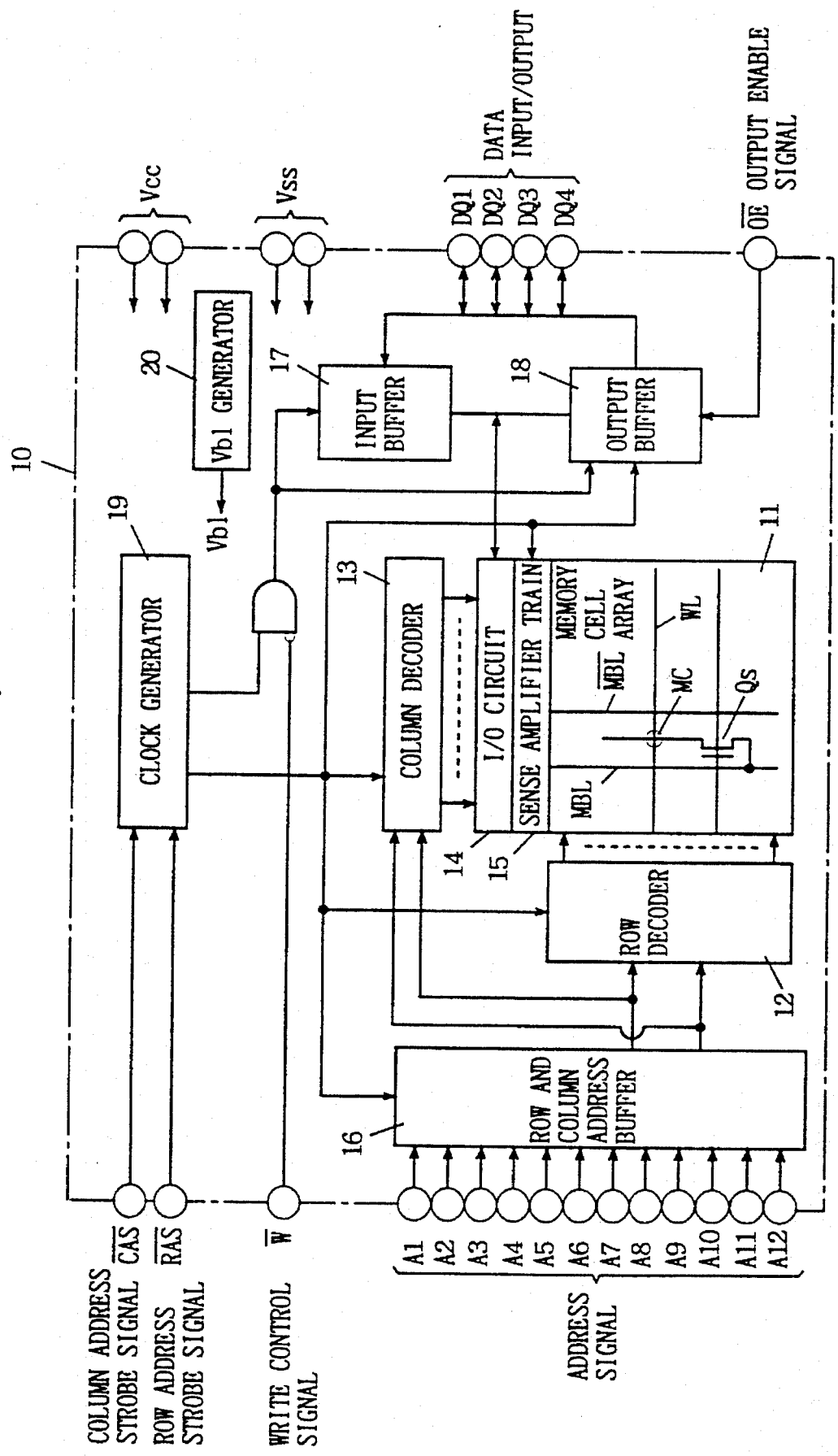
FIG. 1 is a block diagram showing the whole arrangement of a DRAM in accordance with a first embodiment of the present invention.

FIG. 1 is a block diagram showing the whole arrangement of a DRAM in accordance with a first embodiment of the present invention. Referring to FIG. 1, this DRAM is formed on a single semiconductor substrate 10. This DRAM includes a memory cell array 11 in which a plurality of memory cells MC are arranged in a matrix form of rows and columns, a row decoder 12 for selecting one row of memory cell array 11, a column decoder 13 for selecting one column of memory cell array 11, a sense amplifier train 15 for amplifying data from memory cell array 11, and an I/O circuit 14 for inputting/outputting data of a column selected by column decoder 13.

This DRAM further includes a row and column address buffer 16 for supplying external address signals A1–A12 to row decoder 12 and column decoder 13 as row address signals and column address signals, respectively; an input buffer 17 for supplying external input data DQ1–DQ4 to I/O circuit 14; an output buffer 18 for externally supplying data from I/O circuit 14 as output data DQ1–DQ4; a clock generating circuit 19 responsive to a row address strobe signal $\overline{RAS}$ and a column address strobe signal $\overline{CAS}$ for generating various control signals; and a precharge potential generator 20 for generating a precharge potential Vb1 for bit lines.

Figure 2:
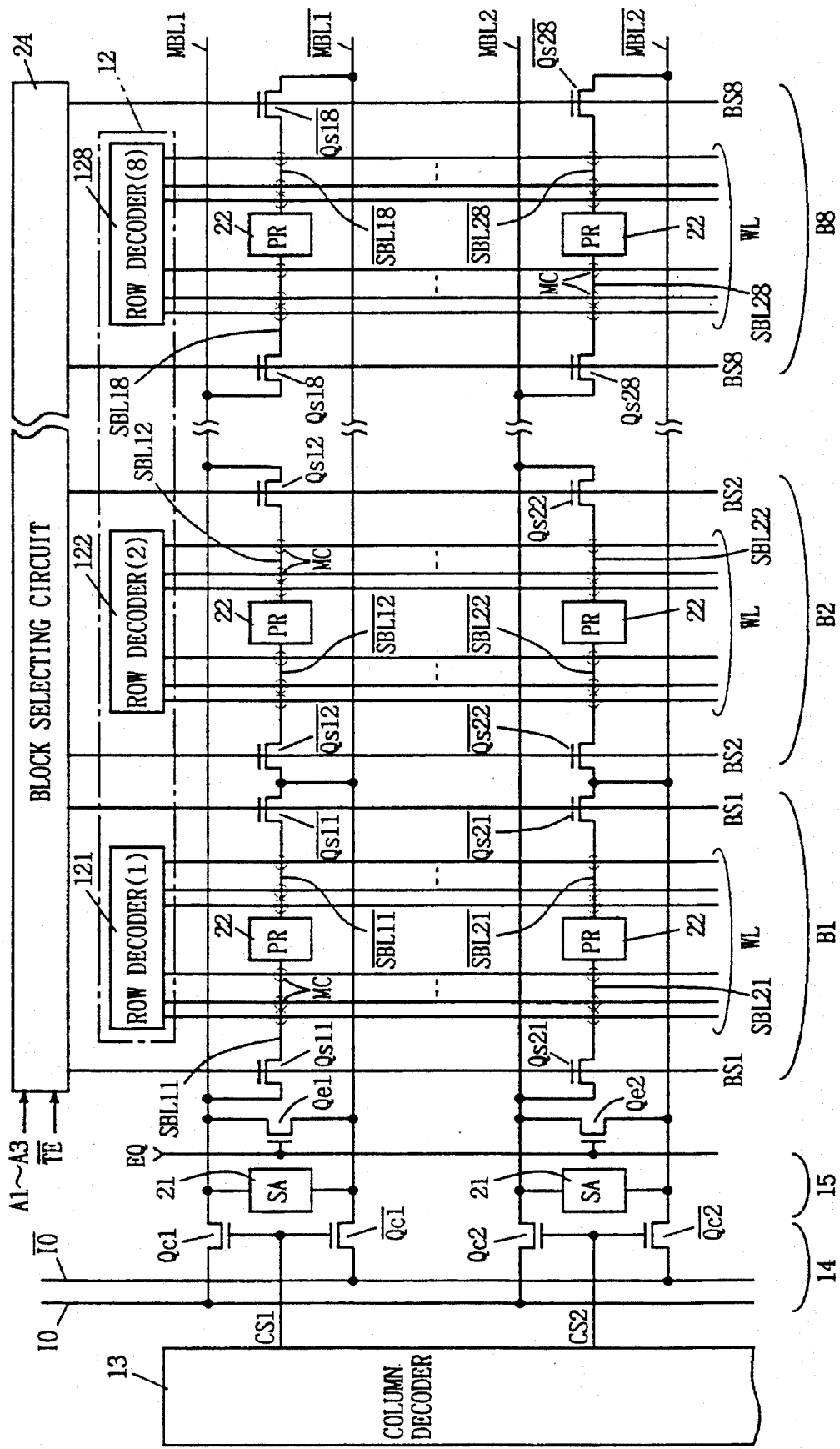
FIG. 2 is a block diagram partially showing an arrangement of a memory cell array of FIG. 1 and peripheral circuits thereof.

FIG. 2 is a block diagram showing two columns of memory cell array 11 shown in FIG. 1 and peripheral circuits thereof. Referring to FIG. 2, this memory cell array 11 is constituted by eight blocks B1–B8. This memory cell array 11 includes a plurality of main bit line pairs located across blocks B1–B8. Only two main bit line pairs MBL1, $\overline{MBL1}$ and MBL2, $\overline{MBL2}$ are representatively shown in FIG. 2. Furthermore, eight sub-bit line pairs are located along each of the main bit line pairs. Only sub-bit line pairs SBL11, $\overline{SBL11}$–SBL18, $\overline{SBL18}$ and SBL21, $\overline{SBL21}$–SBL28, $\overline{SBL28}$ are representatively shown in FIG. 2. Each of the sub-bit line pairs are placed in one corresponding block.

In addition, one selection transistor pair is located corresponding to each of the sub-bit line pairs. Only selection transistor pairs Qs11, $\overline{Qs11}$–Qs18, $\overline{Qs18}$ and Qs21, $\overline{Qs21}$–Qs28, $\overline{Qs28}$ are representatively shown in FIG. 2. One selection transistor of the selection transistor pair is connected between one sub-bit line of a corresponding sub-bit line pair and one main bit line of a corresponding main bit line pair. The other selection transistor of the selection transistor pair is connected between the other sub-bit line of the corresponding sub-bit line pair and the other main bit line of the corresponding main bit line pair. For example, selection transistor Qs11 is connected between sub-bit line SBL11 and main bit line MBL1. On the other hand, selection transistor $\overline{Qs11}$ is connected between sub-bit line $\overline{SBL11}$ and main bit line $\overline{MBL1}$.

Furthermore, a plurality of word lines WL are located across the sub-bit lines. A plurality of memory cells MC are placed at intersections of the sub-bit lines and the word lines, respectively. Memory cell MC is constituted by one access transistor (not shown) and one cell capacitor (not shown), for example. The access transistor is connected between a corresponding sub-bit line and the cell capacitor. The access transistor has its gate electrode connected to a corresponding word line. Row decoder 12 selects one of the plurality of word lines WL, and supplies a boosted potential to the selected word line. Row decoder 12 is divided into eight row decoder portions 121–128 corresponding to blocks B1–B8, respectively. Each of row decoder portions 121–128 selects one word line out of a plurality of word lines WL in a corresponding block.

An N channel MOS transistor for equalization is connected between each main bit line pair. Only transistors Qe1 and Qe2 are representatively shown in FIG. 2. One equalization signal EQ is applied to the gate electrodes of all the transistors for equalization. A sense amplifier (SA) 21 is connected between each main bit line pair. Each sense amplifier 21 amplifies potential difference produced between one corresponding main bit line pair.

One column selection transistor pair is located corresponding to each main bit line pair. Only column selection transistor pairs Qc1, $\overline{Qc1}$ and Qc2, $\overline{Qc2}$ are representatively shown in FIG. 2. Each column selection transistor pair is connected between one corresponding main bit line pair and an I/O line pair IO, $\overline{IO}$. For example, one column selection transistor Qc1 is connected between main bit line MBL1 and I/O line IO, while the other column selection transistor $\overline{Qc1}$ is connected between main bit line $\overline{MBL1}$ and I/O line $\overline{IO}$. Column decoder 13 selects one of the plurality of column selection transistor pairs, and applies a column selection signal to the gate electrodes of both transistors of the selected column selection transistor pair. For example, a column selection signal CS1 is applied to the gate electrodes of column selection transistors Qc1 and $\overline{Qc1}$.

One precharging circuit 22 is provided corresponding to each sub-bit line pair. Each precharging circuit 22 supplies a precharge potential Vb1 generated in precharge potential generator 20 to a corresponding sub-bit line pair. In this case, half a power supply potential Vcc (hereinafter referred to as "intermediate potential") Vcc/2 is supplied as a precharge potential Vb1.

Figure 3:
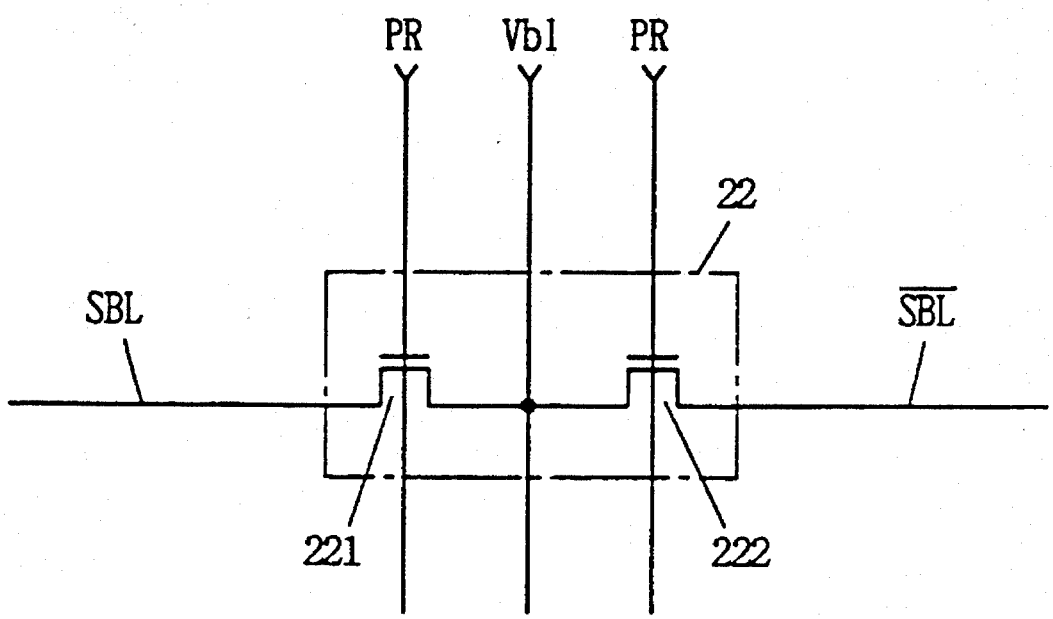
FIG. 3 is a circuit diagram showing a specific arrangement of a precharging circuit of FIG. 2.

FIG. 3 is a circuit diagram showing a specific arrangement of precharging circuit 22. Referring to FIG. 3, precharging circuit 22 is constituted by precharge transistors 221 and 222. Precharge transistors 221 and 222 are rendered conductive in response to a precharge signal PR, so that precharge transistors 221 and 222 supply a precharge potential Vb1 to sub-bit lines SBL and $\overline{SBL}$, respectively.

This DRAM further includes a block selecting circuit 24 responsive to a test enable signal $\overline{TE}$ and address signals A1–A3 for block selection for selectively activating blocks B1–B8. The test enable signal $\overline{TE}$ is at an H (logic high) level in a normal mode and at an L (logic low) level in a test mode. In the normal mode, block selecting circuit 24 selects one of blocks B1–B8 in response to address signals A1–A3. In the test mode, block selecting circuit 24 selects two blocks out of blocks B1–B8 in response to address signals A1–A3.

Figure 4:
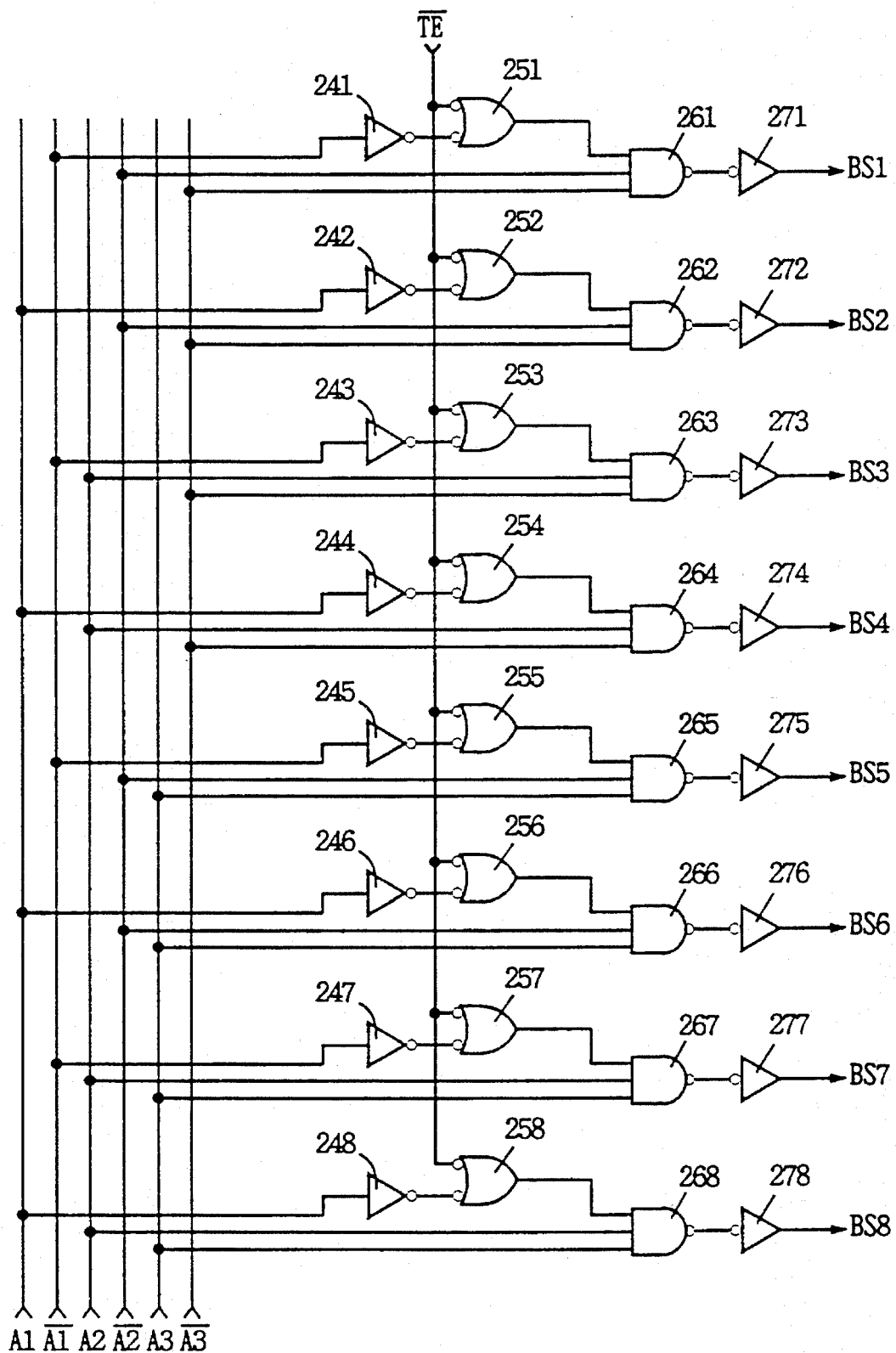
FIG. 4 is a circuit diagram showing a specific arrangement of a block selecting circuit of FIG. 2.

FIG. 4 is a circuit diagram showing a specific arrangement of block selecting circuit 24. Referring to FIG. 4, this block selecting circuit 24 includes eight inverters 241–248, eight NOR gates 251–258, eight NAND gates 261–268, and eight inverters 271–278. Inverter 241 inverts an address signal $\overline{A1}$ complementary to an address signal A1 and applies the inverted signal to one input node of NOR gate 251. Inverter 242 inverts an address signal A1 and applies the inverted signal to one input node of NOR gate 252. Inverter 243 inverts an address signal $\overline{A1}$ and applies the inverted signal to one input node of NOR gate 253. Inverter 244 inverts an address signal A1 and applies the inverted signal to one input node of NOR gate 254. Inverter 245 inverts an address signal $\overline{A1}$ and applies the inverted signal to one input node of NOR gate 255. Inverter 246 inverts an address signal A1 and applies the inverted signal to one input node of NOR gate 256. Inverter 247 inverts an address signal $\overline{A1}$ and applies the inverted signal to one input node of NOR gate 257. Inverter 248 inverts an address signal A1 and applies the inverted signal to one input node of NOR gate 258.

A test enable signal $\overline{TE}$ is applied to the other input node of each of NOR gates 251–258. Each of output signals of NOR gates 251–258 is applied to one input node of each of NAND gates 261–268.

An address signal $\overline{A2}$ complementary to an address signal A2 is applied to another input node of NAND gate 261, and an address signal $\overline{A3}$ complementary to an address signal A3 is applied to other input node thereof. An address signal $\overline{A2}$ is applied to another input node of NAND gate 262, and an address signal $\overline{A3}$ is applied to other input node thereof. An address signal A2 is applied to another input node of NAND gate 263, and an address signal $\overline{A3}$ is applied to other input node thereof. An address signal A2 is applied to another input node of NAND gate 264, and an address signal $\overline{A3}$ is applied to other input node thereof. An address signal $\overline{A2}$ is applied to another input node of NAND gate 265, and an address signal A3 is applied to other input node thereof. An address signal $\overline{A2}$ is applied to another input node of NAND gate 266, and an address signal A3 is applied to other input node thereof. An address signal A2 is applied to another input node of NAND gate 267, and an address signal A3 is applied to other input node thereof. An address signal A2 is applied to another input node of NAND gate 268, and an address signal A3 is applied to a further input node thereof.

Output signals of NAND gates 261–268 are inverted in inverters 271–278, and the inverted signals are applied as block selection signals BS1–BS8 to the gate electrodes of selection transistors, respectively. For example, a block selection signal BS1 is applied to the gate electrodes of all the selection transistors in blocks B1.

(2) Operation

An operation of this DRAM in the normal mode and an operation thereof in the test mode will now be described.

(i) Normal Mode

First, it is assumed that one block other than block B1 has been selected by block selecting circuit 24. More specifically, a block selection signal BS1 at an L level is applied to the gate electrodes of all the selection transistors in block B1. Since all the selection transistors in block B1 are turned off, all the sub-bit line pairs in block B1 will not be connected to the main bit line pairs, respectively. At this time, a precharge signal at an H level is applied to precharging circuit 22 in block B1. Accordingly, all the sub-bit line pairs in block B1 are precharged to an intermediate potential Vcc/2. Furthermore, when data is read from the selected block, one main bit line of the main bit line pair is rendered at an H level and the other at an L level by sense amplifier 21. At this time, if an equalization signal EQ at an H level is applied to the gate electrode of an equalization transistor, the equalization transistor is turned on, so that a potential at the main bit line pair is an intermediate potential Vcc/2.

Then, block B1 is selected by block selecting circuit 24. More specifically, if all the address signals A1–A3 are at an L level, only a block selection signal BS1 is at an H level and other block selection signals BS2–BS8 are at an L level. When the block selection signal BS1 at an H level is applied to the gate electrodes of selection transistors in block B1, all of these selection transistors are turned on. Accordingly, all the sub-bit line pairs in block B1 are connected to main bit line pairs, respectively.

Figure 5:
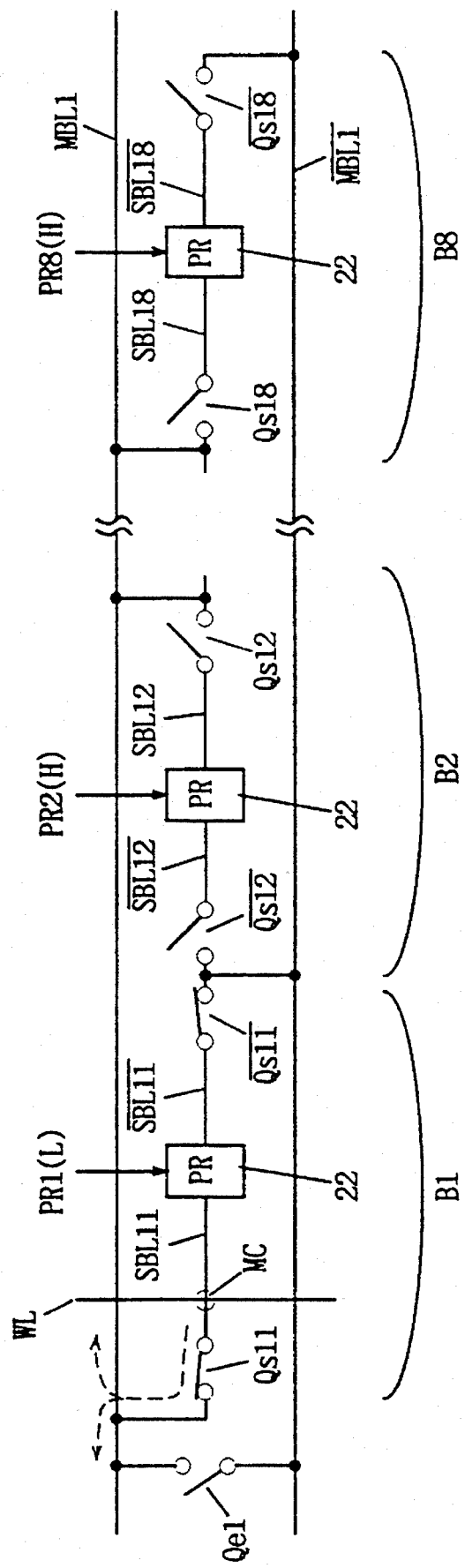
FIG. 5 is a circuit diagram illustrating an operation of the DRAM of FIG. 2 in a normal mode.
Figure 6:
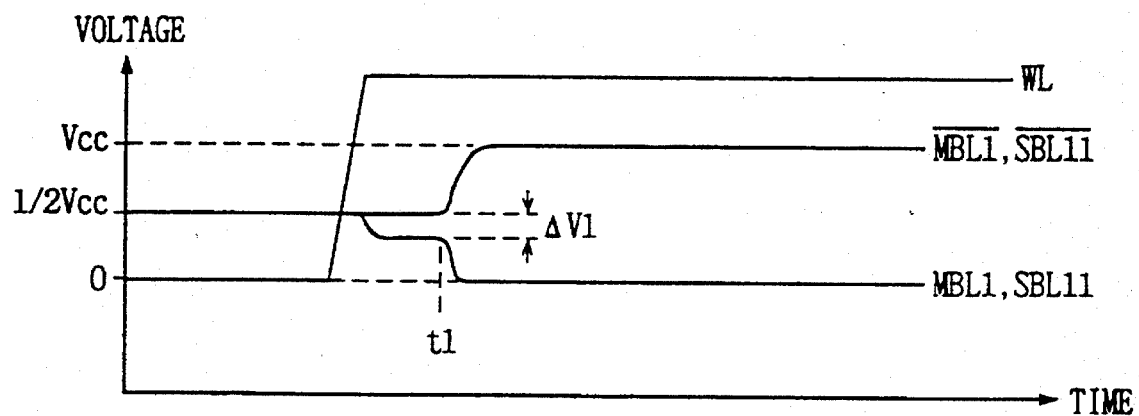
FIG. 6 is a timing chart showing an operation in the normal mode shown in FIG. 5.

FIG. 5 is a circuit diagram showing a first column of memory cell array 11 shown in FIG. 2. Referring to FIG. 5, since selection transistor Qs11 is turned on, sub-bit line SBL11 is connected to main bit line MBL1. On the other hand, since selection transistor $\overline{Qs11}$ is also turned on, sub-bit line $\overline{SBL11}$ is connected to main bit line $\overline{MBL1}$. Furthermore, since other selection transistors are turned off, other sub-bit line pairs SBL12, $\overline{\text{SBL12}}$–SBL18, $\overline{\text{SBL18}}$ will not be connected to main bit line pair MBL1, $\overline{\text{MBL1}}$. At this time, precharge signals PR2–PR8 at an H level continue to be applied to precharging circuits 22 in blocks B2–B8, respectively, and therefore sub-bit line pairs SBL12, $\overline{\text{SBL12}}$–SBL18, $\overline{\text{SBL18}}$ continue to be precharged. Since a precharge signal PR1 applied to precharging circuit 22 in block B1 is at an L level, precharge of sub-bit line pair SBL11, $\overline{\text{SBL11}}$ is completed. As shown in FIG. 6, however, a potential at sub-bit line pair SBL11, $\overline{\text{SBL11}}$ and main bit line pair MBL1, $\overline{\text{MBL1}}$ is maintained at an intermediate potential Vcc/2.

Then, one of a plurality of word lines WL in block B1 is selected by row decoder 12. A potential at the selected word line WL is higher than the power supply potential Vcc, as shown in FIG. 6. Thus, data is read from memory cells MC connected to the word line WL to sub-bit line SBL11 and main bit line MBL1. For example, if the memory cells MC have stored data at an L level, a potential at main bit line MBL1 and sub-bit line SBL11 is reduced from an intermediate potential Vcc/2 by ΔV1, as shown in FIG. 6. Therefore, read potential difference ΔV1 is produced between main bit lines MBL1 and $\overline{\text{MBL1}}$. If the capacitance of a cell capacitor in a memory cell MC is represented by Cs, the parasitic capacitance of a sub-bit line by Csub and the parasitic capacitance of a main bit line by Cmain, this read potential difference ΔV1 is defined by the following equation.

$$\Delta V1 = Cs/(Csub+Cmain+Cs)$$

Thereafter, at time t1, sense amplifier 21 is activated and the read potential difference ΔV1 is amplified, so that a potential at main bit line MBL1 and sub-bit line MBL11 is 0 volt, while a potential at main bit line $\overline{\text{MBL1}}$ and sub-bit line $\overline{\text{SBL11}}$ is power supply potential Vcc. Then, a column selection signal CS1 at an H level is applied to the gate electrodes of column selection transistors Qc1 and $\overline{\text{Qc1}}$, and thus both transistors Qc1 and $\overline{\text{Qc1}}$ are turned on. Therefore, a potential at main bit line MBL1 is transmitted through column selection transistor Qc1 to I/O line IO, while a potential at main bit line $\overline{\text{MBL1}}$ is transmitted through column selection transistor $\overline{\text{Qc1}}$ to I/O line $\overline{\text{IO}}$. Data produced on the I/O line pair IO, $\overline{\text{IO}}$ is output through output buffer 18 of FIG. 1.

(ii) Test Mode

On the other hand, in the test mode, a test enable signal TE is at an L level. This test enable signal $\overline{\text{TE}}$ at an L level is applied to all the NOR gates 251–258 in block selecting circuit 24 shown in FIG. 4. Therefore, an output signal of NOR gate 251 is always at an H level regardless of whether an address signal A1 is at an H level or at an L level. Accordingly, if all the address signals A1–A3 are at an L level, not only block selection signal BS1 but also block selection signal BS2 attains an H level. Thus, block B2 is selected whenever block B1 is selected.

According to this block selecting circuit 24, block B1 is selected whenever block B2 is selected. In addition, whenever one of blocks B3 and B4 is selected, the other block is also selected. Whenever one of blocks B5 and B6 is selected, the other block is also selected. Furthermore, whenever one of blocks B7 and B8 is selected, the other block is also selected.

Figure 7:
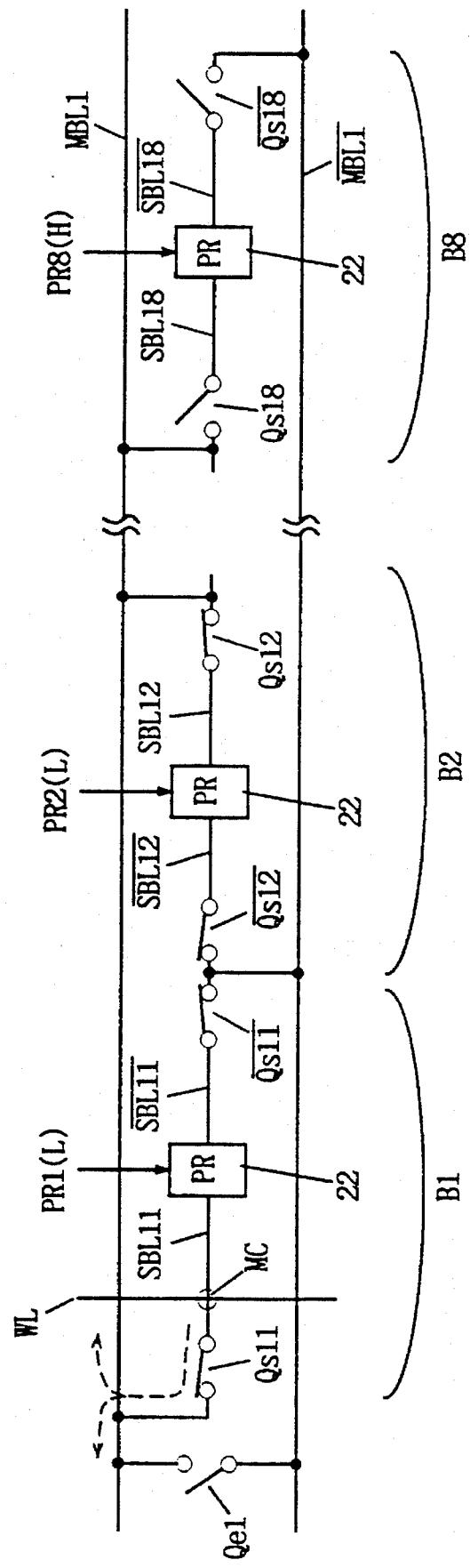
FIG. 7 is a circuit diagram illustrating an operation of the DRAM of FIG. 2 in a test mode.
Figure 8:
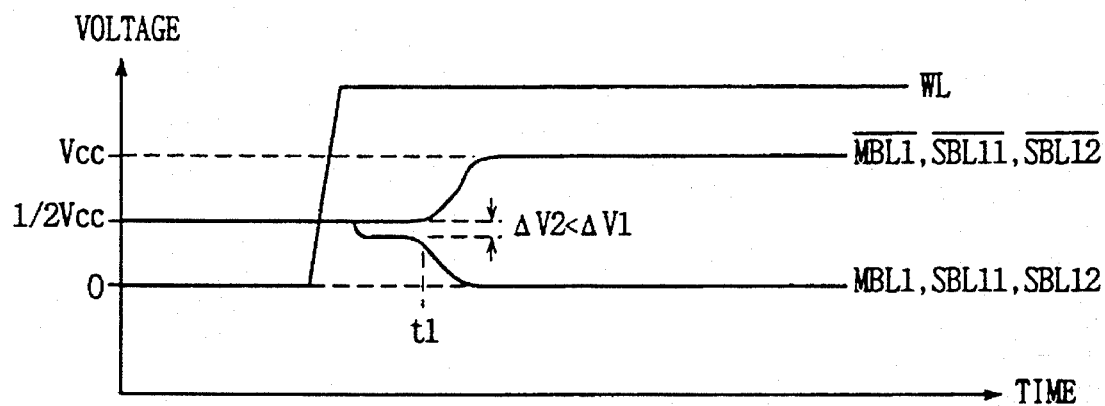
FIG. 8 is a timing chart showing an operation in the test mode shown in FIG. 7.

FIG. 7 is a circuit diagram showing an example in which block B1 is selected in the test mode. If a block selection signal BS1 at an H level is applied to the gate electrodes of all the selection transistors in block B1, all of the selection transistors are turned on, so that sub-bit line pairs in block B1 are connected to main bit line pairs, respectively. At this time, since a block selection signal BS2 at an H level is also applied to the gate electrodes of all the selection transistors in block B2, the selection transistors in block B2 are rendered conductive, so that sub-bit line pairs in block B2 are also connected to the main bit line pairs, respectively. For example, as shown in FIG. 7, sub-bit line SBL12 as well as sub-bit line SBL11 are connected to main bit line MBL1, while sub-bit line $\overline{\text{SBL12}}$ as well as sub-bit line $\overline{\text{SBL11}}$ are connected to main bit line $\overline{\text{MBL1}}$. At this time, a precharge signal PR2 at an L level is applied to precharging circuit 22 in block B2 just as a precharge signal PR1 at an L level is applied to precharging circuit 22 in block B1. Consequently, precharge of all the sub-bit line pairs in blocks B1 and B2 is completed.

Thereafter, one word line WL in block B1 is selected, and data is read from memory cells MC connected to the selected word line W1 to sub-bit line SBL11 and main bit line MBL1, as in the case of the above mentioned normal mode. Provided that data at an L level, for example, has been stored in this memory cell MC, when a potential at the word line WL increases, a potential at main bit line $\overline{\text{MBL1}}$ is maintained at an intermediate potential Vcc/2 while a potential at main bit line MBL1 is reduced from the intermediate potential Vcc/2 by ΔV2. Therefore, read potential difference ΔV2 is produced between main bit lines MBL1 and $\overline{\text{MBL1}}$. This read potential difference ΔV2 is defined by the following equation.

$$\Delta V2 = Cs/(2Csub+Cmain+Cs)$$

Thus, in the test mode, since not only sub-bit line pair SBL11, $\overline{\text{SBL11}}$ but also sub-bit line pair SBL12, $\overline{\text{SBL12}}$ are connected to main bit line pair MBL1, $\overline{\text{MBL1}}$, the total parasitic capacitance of the main bit lines and the sub-bit lines is larger than that in the case of the normal mode. Therefore, as can be seen from comparison between above mentioned two equations respectively defining read potential differences ΔV1 and ΔV2, the read potential difference ΔV2 in the test mode is smaller than the read potential difference ΔV1 in the normal mode. Accordingly, whether the read potential difference is correctly amplified or not can be tested even in a harsh condition of small read potential difference.

Although two sub-bit line pairs are herein connected to one corresponding main bit line pair in the test mode, more than two sub-bit line pairs may be connected to one corresponding main bit line pair. In addition, although eight blocks are provided herein, the number of blocks is not limited to this, of course.

As has been described, according to the first embodiment, since at least two sub-bit line pairs are connected to one corresponding main bit line pair in the test mode, the total parasitic capacitance of the main bit line pair and the sub-bit line pairs connected thereto is larger than that in the case of the normal mode. Therefore, read potential difference in the test mode is smaller than that in the normal mode. Thus, since the read potential difference is intentionally reduced in the test mode, harsh test of read operation margin can be performed.

Generally, various test patterns such as external application of noise and reduction in the power supply potential Vcc are required in order to intentionally reduce the read potential difference. However, since the read potential difference can be reduced easily according to the first embodiment, strict test of read operation margin can be performed for a short time. Consequently, DRAM having wide read operation margin can be selected quickly.

[Second Embodiment]

Figure 9:
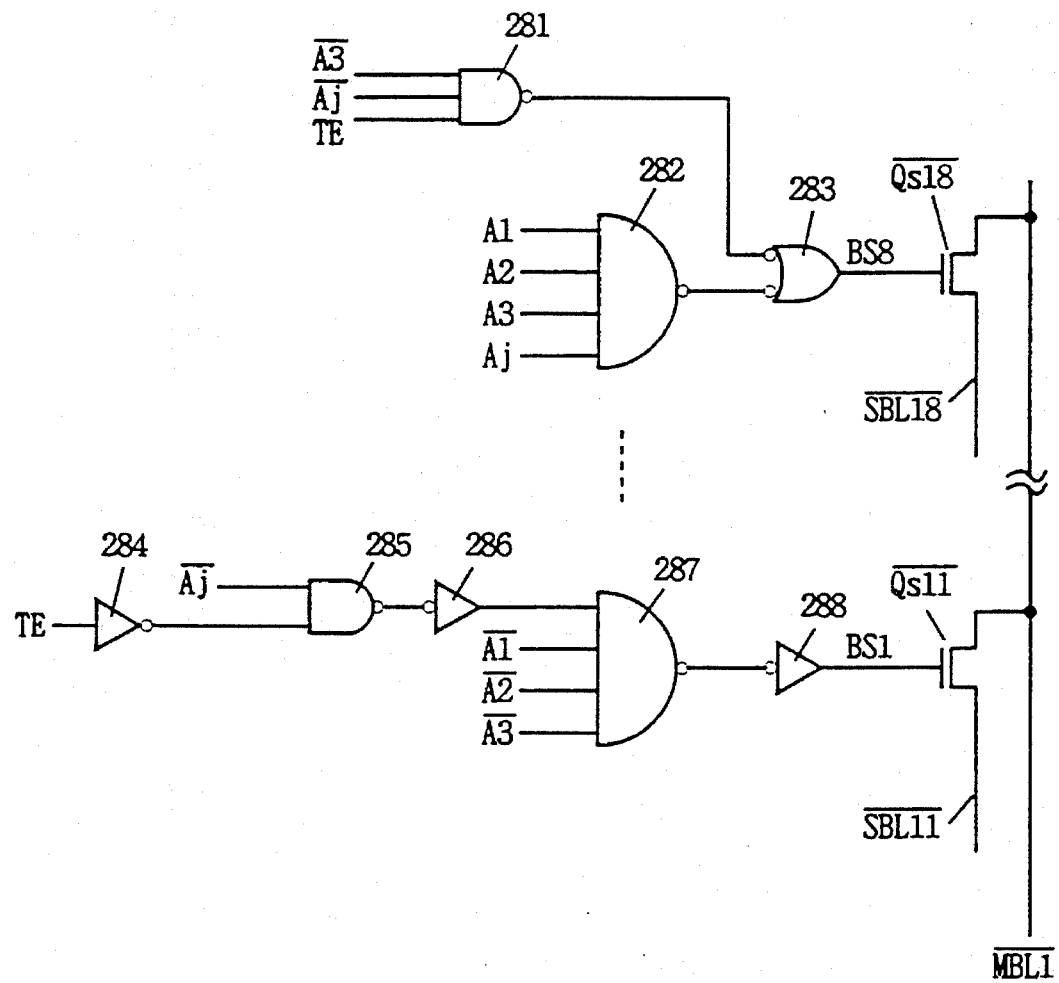
FIG. 9 is a circuit diagram partially showing an arrangement of a block selecting circuit in a DRAM in accordance with a second embodiment of the present invention.

FIG. 9 is a circuit diagram partially showing an arrangement of a block selecting circuit in a DRAM in accordance with a second embodiment of the present invention. Referring to FIG. 9, the block selecting circuit of the second embodiment includes NAND gates 281 and 282, and an NOR gate 283. Address signals A1–A3 are applied to three input nodes of NAND gate 282, respectively, as in the case of the first embodiment. An address signal Aj for selecting a sub-bit line is applied to another input node of NAND gate 282. In addition, an address signal $\overline{A3}$ is applied to one input node of NAND gate 281, an address signal $\overline{Aj}$ complementary to the address signal Aj is applied to another input node thereof, and a test enable signal TE is applied to other input node thereof. Both output signals of NAND gates 281 and 282 are applied to NOR gate 283. An output signal of NOR gate 283 is applied to the gate electrode of a selection transistor $\overline{Qs18}$ as a block selection signal BS8.

The block selecting circuit of the second embodiment further includes inverters 284, 286, and 288, and NAND gates 285 and 287. A test enable signal TE is inverted by inverter 284, and the inverted signal is applied to one input node of NAND gate 285. An address signal $\overline{Aj}$ is applied to the other input node of NAND gate 285. An output signal of NAND gate 285 is inverted by inverter 286, and the inverted signal is applied to one input node of NAND gate 287. Address signals $\overline{A1}$–$\overline{A3}$ are applied to other three input nodes of NAND gate 287, respectively, as in the case of the first embodiment. An output signal of NAND gate 287 is inverted by inverter 288, and the inverted signal is applied to the gate electrode of a selection transistor $\overline{Qs11}$ and the like as a block selection signal BS1.

In the second embodiment, in the case of the normal mode, that is, when the test enable signal TE is at an L level, operation thereof is similar to that in the case of the normal mode of the first embodiment.

On the other hand, in the test mode, that is, when the test enable signal TE is at an H level, only the block selection signal BS1 applied to selection transistor $\overline{Qs11}$ is at an L level, so that selection transistor $\overline{Qs11}$ is turned off. On the contrary, only the block selection signal BS8 applied to selection transistor $\overline{Qs18}$ attains an H level, so that selection transistor $\overline{Qs18}$ is turned on.

Figure 10:
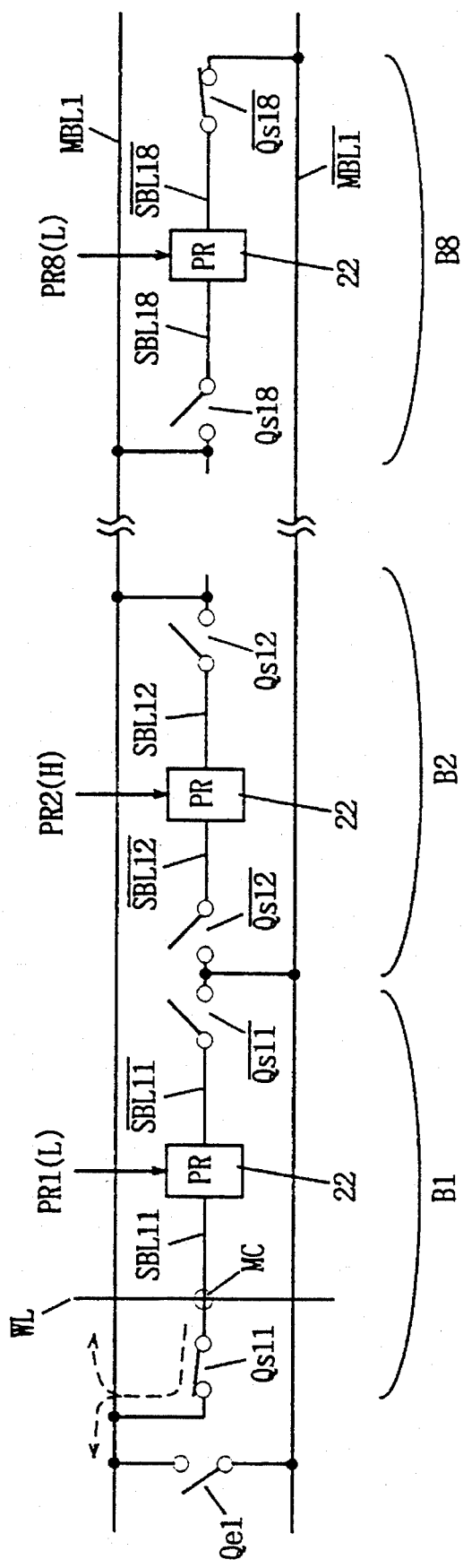
FIG. 10 is a circuit diagram illustrating an operation of the DRAM in a test mode in accordance with the second embodiment of the present invention.

More specifically, as shown in FIG. 10, in the test mode, when a block B1 is selected, only selection transistor Qs11 in block B1 is turned on, and selection transistor $\overline{Qs18}$ in a block B8 instead of selection transistor $\overline{Qs11}$ is turned on. Accordingly, a sub-bit line SBL11 does not form a pair with a sub-bit line $\overline{SBL11}$ but with a sub-bit line $\overline{SBL18}$.

Figure 11:
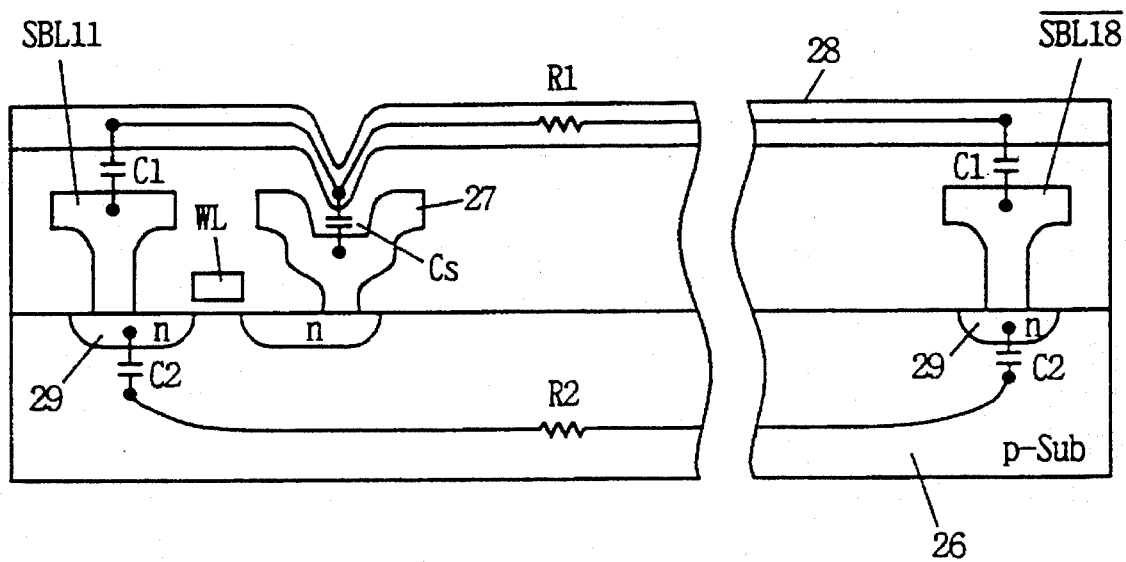
FIG. 11 is a cross section of a memory cell array illustrating effects obtained in the second embodiment of the present invention.

FIG. 11 is a cross section partially showing an arrangement of a memory cell array in this DRAM. Referring to FIG. 11, capacitances Cs, C1 and the like are generally formed between a cell plate 28 and a storage node 27, sub-bit lines SBL11 and $\overline{SBL18}$ and the like, respectively. In addition, capacitance C2 is formed between a semiconductor substrate 26 and a source/drain region of an access transistor in a memory cell. Therefore, if noise is generated in cell plate 28, the noise is transmitted through capacitance C1 to sub-bit lines SBL11, $\overline{SBL18}$ and the like. Furthermore, if noise is generated in semiconductor substrate 26, the noise is transmitted through capacitance C2 to sub-bit lines SBL11, $\overline{SBL18}$ and the like. Accordingly, noises at the same level are transmitted to adjacent sub-bit lines while noises at different levels are transmitted to bit lines spaced apart from each other, respectively. This is because an effect of a resistance R1 in cell plate 28 or a resistance R2 in semiconductor substrate 26 cannot be ignored between bit lines spaced apart from each other.

If sub-bit line SBL11 forms a pair with sub-bit line $\overline{SBL18}$ located at a distance away therefrom, as described above, noise applied to sub-bit line SBL11 will not be the same as that applied to sub-bit line $\overline{SBL18}$. Accordingly, even if potential difference between sub-bit lines SBL11 and $\overline{SBL18}$ is amplified by a sense amplifier 21, these noises will not be completely offset. Consequently, test of read operation can be carried out in a harsh condition for a noise margin.

Although sub-bit line SBL11 forms a pair with sub-bit line $\overline{SBL18}$ in the second embodiment, sub-bit lines which forms a pair are not limited so long as these sub-bit lines are spaced apart from each other.

As has been described above, according to the second embodiment, since one sub-bit line is connected to one main bit line and the other sub-bit line located at a distance from the sub-bit line is connected to the other main bit line in the test mode, noises respectively applied to these sub-bit lines will not be offset intentionally. Consequently, accelerated test of noise margin can be carried out.

[Third Embodiment]

Figure 12:
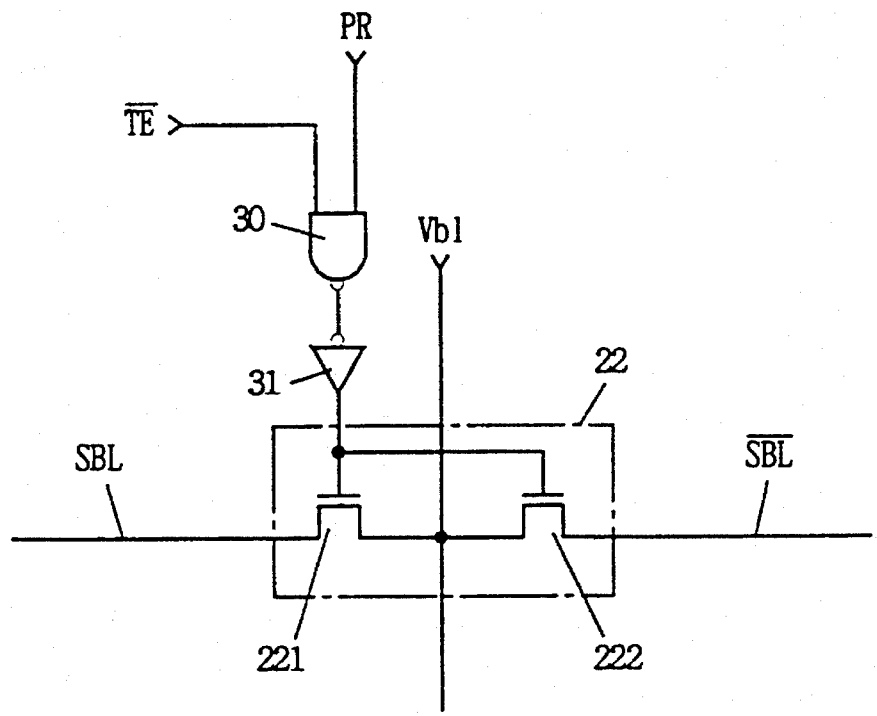
FIG. 12 is a circuit diagram showing an arrangement of a precharging circuit and peripheral circuits thereof in a DRAM in accordance with a third embodiment of the present invention.

FIG. 12 is a circuit diagram showing a precharging circuit 22 and peripheral circuits thereof in a DRAM in accordance with a third embodiment of the present invention. Referring to FIG. 12, in the third embodiment, a precharge signal PR is not applied directly to the gate electrodes of transistors 221 and 222 but through an NAND gate 30 and an inverter 31. In other words, the precharge signal PR is applied to one input node of NAND gate 30, and a test enable signal $\overline{TE}$ is applied to the other input node thereof. Accordingly, since the test enable signal $\overline{TE}$ at an H level is applied in a normal mode, the precharge signal PR is applied as it is to the gate electrodes of transistors 221 and 222 in precharging circuit 22. On the other hand, since the test enable signal $\overline{TE}$ at an L level is applied in a test mode, a signal at an L level is applied to the gate electrodes of transistors 221 and 222 in precharging circuit 22 at all times. Therefore, both transistors 221 and 222 are turned off, so that sub-bit lines SBL and $\overline{SBL}$ will not be precharged.

FIGS. 13A–13D are circuit diagrams illustrating an operation of the third embodiment. The operation of the third embodiment will be described herein in conjunction with a block B2.

As shown in FIG. 13A, both selection transistors Qs12 and $\overline{Qs12}$ in block B2 are off, and a precharge signal PR2 at an H level is applied to precharging circuit 22. Accordingly, both sub-bit lines SBL12 and $\overline{SBL12}$ have been precharged to an intermediate potential Vcc/2.

Then, as shown in FIG. 13B, when a block B1 is selected, both selection transistors Qs11 and $\overline{Qs11}$ in block B1 are turned on, and data is read from a memory cell MC in block B1. Sub-bit line pairs in non-selected blocks other than a selected block continue to be precharged in the normal mode, while precharge of the sub-bit line pairs is stopped in the test mode. In this case, precharge of sub-bit lines SBL12 and $\overline{SBL12}$ in block B2 is stopped. Sub-bit lines SBL12 and $\overline{SBL12}$ are in an electrically floating state.

Thereafter, as shown in FIG. 13C, a main bit line MBL1 at a power supply potential Vcc and a main bit line $\overline{MBL1}$ at a ground potential are shorted by an equalization transistor Qe1, so that a potential at main bit lines MBL1 and $\overline{MBL1}$ is an intermediate potential Vcc/2. Precharge of sub-bit lines SBL12 and $\overline{SBL12}$ in block B2 is being stopped during this period as well. Therefore, charges at sub-bit lines SBL12 and $\overline{SBL12}$ leak through a PN junction into a semiconductor substrate. Thus, since precharge in the non-selected block 2 is stopped, a potential at these sub-bit lines SBL12 and $\overline{\text{SBL12}}$ becomes lower than the intermediate potential Vcc/2 as shown in FIG. 14.

Figure 14:
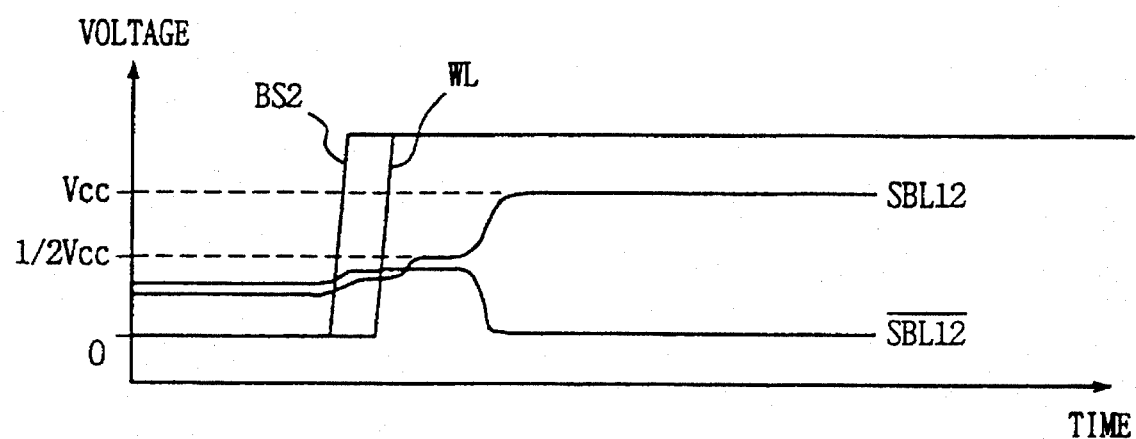
FIG. 14 is a timing chart showing an operation shown in FIGS. 13A to 13D.

Then, when a block selection signal BS2 rises as shown in FIG. 14, selection transistors Qs12 and $\overline{\text{Qs12}}$ in block B2 are turned on. Thus, although charges flow slightly from main bit line pair MBL1, $\overline{\text{MBL1}}$ into sub-bit line pair SBL12, $\overline{\text{SBL12}}$, a potential at sub-bit line pair SBL12, $\overline{\text{SBL12}}$ will not increase up to the intermediate potential Vcc/2.

Thereafter, when a potential at a word line WL increases as shown in FIG. 14, data is read from memory cells MC connected to the word line WL to sub-bit line $\overline{\text{SBL12}}$ and main bit line $\overline{\text{MBL1}}$ as shown in FIG. 13D. Accordingly, potential difference is produced between main bit line pair MBL1, $\overline{\text{MBL1}}$, and the potential difference is amplified by a sense amplifier.

As has been described above, according to the third embodiment, precharge in non-selected blocks is stopped, and therefore, a potential at sub-bit line pairs in the non-selected blocks becomes lower than the intermediate potential Vcc/2 although data is going to be read to the sub-bit line pair. Accordingly, it is difficult for a sense amplifier to surely amplify potential difference produced between the main bit line pair. Thus, since a potential at a sub-bit line pair to which data is to be read is forced to be lower than the intermediate potential Vcc/2 intentionally, test of a sensing operation can be carried out in a harsh condition for a sensing operation margin.

[Fourth Embodiment]

Figure 15:
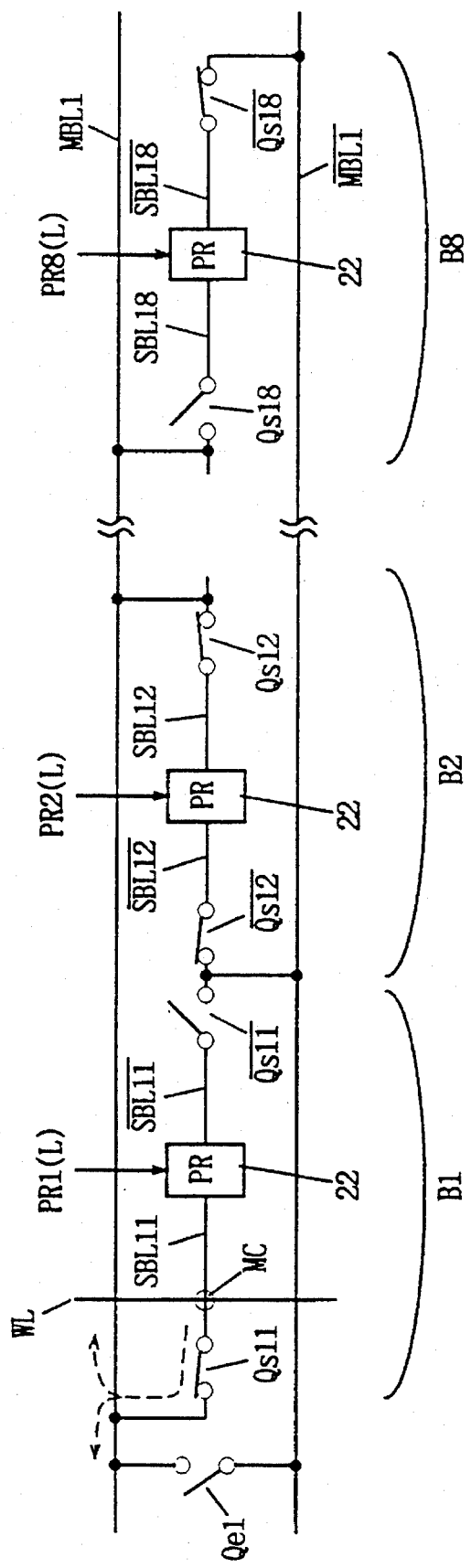
FIG. 15 is a circuit diagram illustrating an operation of a DRAM in accordance with a fourth embodiment of the present invention.

FIG. 15 is a circuit diagram illustrating an operation of a DRAM in accordance with a fourth embodiment of the present invention. The fourth embodiment results from combination of the first and the second embodiments.

Referring to FIG. 15, a selection transistor Qs11 in a selected block B1 is on, while a selection transistor $\overline{\text{Qs11}}$ is off. At this time, both selection transistors Qs12 and $\overline{\text{Qs12}}$ in a block B2 are on. Furthermore, a selection transistor $\overline{\text{Qs18}}$ in a block B8 is on.

Accordingly, block B2 is selected at the same time that block B1 is selected, the total parasitic capacitance of the main and the sub-bit line pairs increases by an amount of a sub-bit line pair SBL12, $\overline{\text{SBL12}}$. Furthermore, since a sub-bit line SBL11 forms a pair with a sub-bit line $\overline{\text{SBL18}}$ located at a distance therefrom, noises applied to these sub-bit lines SBL11 and $\overline{\text{SBL18}}$ will not be completely offset.

According to the fourth embodiment, accelerated test of read operation margin can be carried out by intentionally reducing read potential difference as well as intentionally increasing noise applied to sub-bit line pairs.

[Fifth Embodiment]

Figure 16:
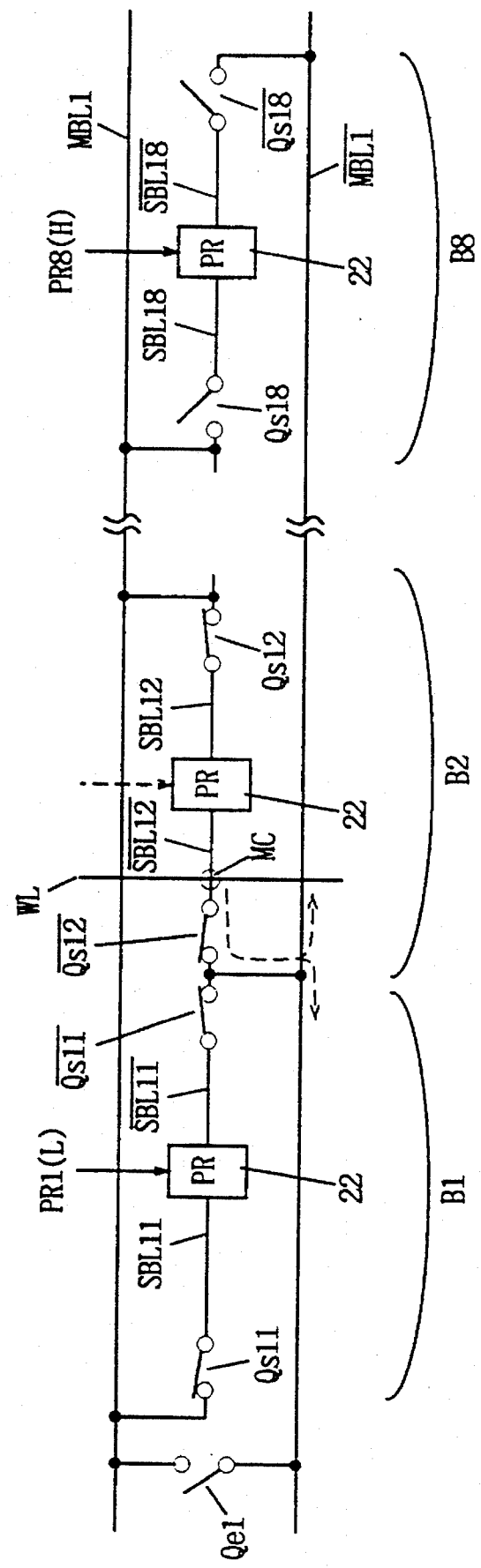
FIG. 16 is a circuit diagram illustrating an operation of a DRAM in accordance with a fifth embodiment of the present invention.

FIG. 16 is a circuit diagram illustrating an operation of a DRAM in accordance with a fifth embodiment of the present invention. The fifth embodiment results from combination of the first and the third embodiments.

Referring to FIG. 16, precharge in a block B2 to be selected is stopped in the fifth embodiment. Accordingly, a potential at a sub-bit line pair SBL12, $\overline{\text{SBL12}}$ is reduced from an intermediate potential Vcc/2 right before data is read in this block B2.

In addition, a block B1 is selected at the same time that block B2 is selected. In other words, selection transistors Qs11 and $\overline{\text{Qs11}}$ in block B1 are also turned on. Accordingly, the total parasitic capacitance of the main and the sub-bit line pairs increases by an amount of a sub-bit line pair SBL11, $\overline{\text{SBL11}}$.

According to the fifth embodiment, since a potential at a sub-bit line pair is lower than the intermediate potential right before data is read, accelerated test of a sensing operation can be carried out, and at the same time, since the total parasitic capacitance of main and sub-bit lines increases, accelerated test of a read operation margin can be carried out.

[Sixth Embodiment]

Figure 17:
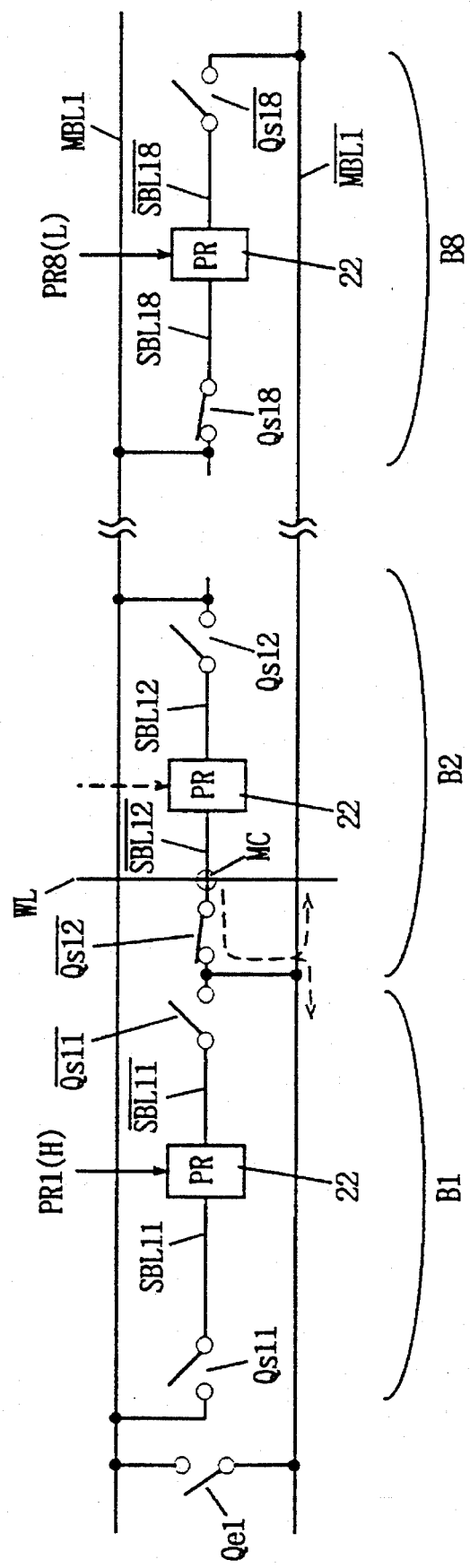
FIG. 17 is a circuit diagram illustrating an operation of a DRAM in accordance with a sixth embodiment of the present invention.

FIG. 17 is a circuit diagram illustrating an operation of a DRAM in accordance with a sixth embodiment of the present invention. The sixth embodiment results from combination of the second and the third embodiments.

Referring to FIG. 17, a block B2 is selected in the sixth embodiment. However, in this block B2, precharge is stopped before data is read, so that a potential at a sub-bit line pair SBL12, $\overline{\text{SBL12}}$ becomes lower than an intermediate potential Vcc/2. Thus, since data is read with a potential at the sub-bit line pair SBL12, $\overline{\text{SBL12}}$ lower than the intermediate potential Vcc/2, it is difficult for a sense amplifier to surely amplify this data.

In addition, a selection transistor $\overline{\text{Qs12}}$ in the selected block B2 is on, while a selection transistor Qs12 is off. However, a selection transistor Qs18 in a block B8 is on instead of selection transistor Qs12 which is off. Accordingly, since a sub-bit line $\overline{\text{SBL12}}$ forms a pair with a sub-bit line SBL18 located at a distance therefrom, noises applied to sub-bit lines $\overline{\text{SBL12}}$ and SBL18 will not be completely offset.

According to the sixth embodiment, since noise applied to sub-bit line pairs is not completely offset, accelerated test of a noise margin can be carried out, and at the same time, since a potential at a sub-bit line pair to which data is to be read is lower than the intermediate potential, accelerated test of a sensing operation margin can be carried out.

[Seventh Embodiment]

Figure 18:
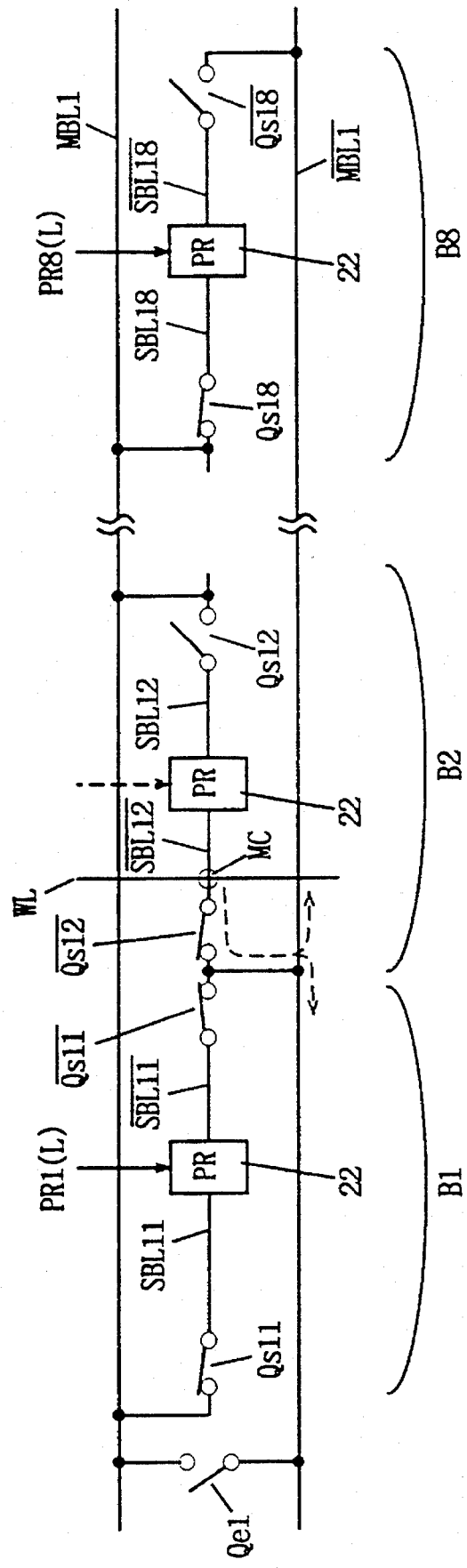
FIG. 18 is a circuit diagram illustrating an operation of a DRAM in accordance with a seventh embodiment of the present invention.

FIG. 18 is a circuit diagram illustrating an operation of a DRAM in accordance with a seventh embodiment of the present invention. The seventh embodiment results from combination of the first, the second and the third embodiments.

Referring to FIG. 18, a block B2 is selected in the seventh embodiment. However, a block B1 is also selected in addition to the block B2. According, selection transistors Qs11 and $\overline{\text{Qs11}}$ in block B1 are also turned on. Furthermore, precharge in block B2 to be selected has been stopped before data is read. Therefore, a potential at a sub-bit line pair SBL12, $\overline{\text{SBL12}}$ has been lower than an intermediate potential Vcc/2 before data is read. Furthermore, a selection transistor $\overline{\text{Qs12}}$ in the selected block B2 is turned on, while a selection transistor Qs12 is kept off. A selection transistor Qs18 in a block B8 instead of this selection transistor Qs12 is turned on. Accordingly, sub-bit line $\overline{\text{SBL12}}$ forms a pair with a sub-bit line SBL18 located at a distance therefrom.

According to the seventh embodiment, since the total parasitic capacitance of main and sub-bit line pairs increases, accelerated test of a read operation margin can be carried out. In addition, since a potential at a sub-bit line pair is lower than the intermediate potential right before data is read, accelerated test of a sensing operation margin can be carried out. Furthermore, since two sub-bit lines which are spaced apart from each other form a pair, accelerated test of a noise margin can be carried out.

[Other Embodiments]

Although various embodiments of the present invention have been described in detail, the present invention is not limited to the embodiments described above. For example, although a sub-bit line pair has a so-called open bit line structure in the above described embodiments, a sub-bit line pair may have a folded bit line structure. In addition, although a memory cell is constituted by one access transistor and one cell capacitor in the above described embodiments, a DINOR (Divided bit line NOR) flash memory device using a so-called floating gate type transistor for a memory cell can be used. The DINOR flash memory is disclosed in detail in pp. 454–458 of IEEE JOURNAL OF SOLID-STATE CIRCUITS, Vol. 29, No. 4, April 1994, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of testing an operation of a semiconductor memory device including
   a main bit line pair,
   a plurality of sub-bit line pairs provided corresponding to said main bit line pair,
   a plurality of transistor pairs provided respectively corresponding to said plurality of sub-bit line pairs, each transistor pair being responsive to a prescribed selection signal for connecting one sub-bit line of a corresponding sub-bit line pair to one main bit line of said main bit line pair and connecting another sub-bit line thereof to another main bit line thereof,
   a plurality of word lines located across said plurality of sub-bit line pairs, and
   a plurality of memory cells provided respectively corresponding to intersections of said plurality of sub-bit line pairs and said plurality of word lines, each memory cell being connected to a corresponding sub-bit line pair and a corresponding word line, comprising the steps of:
   precharging at least two sub-bit line pairs out of said plurality of sub-bit line pairs;
   applying said selection signal to two transistor pairs respectively corresponding to said two sub-bit line pairs to render said two transistor pairs conductive;
   driving one word line out of said plurality of word lines, which is located across one sub-bit line pair of said two sub-bit line pairs; and
   amplifying potential difference generated between said main bit line pair.

2. A method of testing an operation of a semiconductor memory device including
   a main bit line pair,
   a plurality of sub-bit line pairs provided corresponding to said main bit line pair,
   a plurality of transistor pairs provided respectively corresponding to said plurality of sub-bit line pairs, each transistor pair being responsive to a prescribed selection signal for connecting one sub-bit line of a corresponding sub-bit line pair to one main bit line of said main bit line pair and connecting another sub-bit line thereof to another main bit line thereof,
   a plurality of word lines located across said plurality of sub-bit line pairs, and
   a plurality of memory cells provided respectively corresponding to intersections of said plurality of sub-bit line pairs and said plurality of word lines, each memory cell being connected to a corresponding sub-bit line pair and a corresponding word line, comprising the steps of:
   precharging one sub-bit line of at least one sub-bit line pair out of said plurality of sub-bit line pairs, and another sub-bit line of another sub-bit line pair other than a sub-bit line pair adjacent to said one sub-bit line pair;
   applying said selection signal to one transistor, which corresponds to said one sub-bit line pair, of a transistor pair corresponding to said one sub-bit line pair to render said one transistor conductive, and applying said selection signal to another transistor, which corresponds to said another sub-bit line, of a transistor pair corresponding to said another sub-bit line pair to render said another transistor conductive;
   driving one word line out of said plurality of word lines, which is located across said one sub-bit line pair; and
   amplifying potential difference generated between said main bit line pair.

3. A method of testing an operation of a semiconductor memory device including
   a main bit line pair,
   a plurality of sub-bit line pairs provided corresponding to said main bit line pair,
   a plurality of transistor pairs provided respectively corresponding to said plurality of sub-bit line pairs, each transistor pair being responsive to a prescribed selection signal for connecting one sub-bit line of a corresponding sub-bit line pair to one main bit line of said main bit line pair and connecting another sub-bit line thereof to another main bit line thereof,
   a plurality of word lines located across said plurality of sub-bit line pairs, and
   a plurality of memory cells provided respectively corresponding to intersections of said plurality of sub-bit line pairs and said plurality of word lines, each memory cell being connected to a corresponding sub-bit line pair and a corresponding word line, comprising the steps of:
   initiating precharge of at least one sub-bit line pair out of said plurality of sub-bit line pairs;
   completing precharge of said one sub-bit line pair;
   reading data from one memory cell out of memory cells connected to another sub-bit line pair out of said plurality of sub-bit line pairs; and
   reading data from one memory cell out of memory cells connected to said one sub-bit line pair.

4. A semiconductor memory device which can be subjected to an operation test in response to a prescribed test enable signal, comprising:
   a main bit line pair;
   a plurality of sub-bit line pairs provided corresponding to said main bit line pair;
   a plurality of transistor pairs provided respectively corresponding to said plurality of sub-bit line pairs, each transistor pair being responsive to a prescribed selection signal for connecting one sub-bit line of a corresponding sub-bit line pair to one main bit line of said main bit line pair and connecting another sub-bit line thereof to another main bit line thereof;
   a plurality of word lines located across said plurality of sub-bit line pairs;
   a plurality of memory cells provided respectively corresponding to intersections of said plurality of sub-bit line pairs and said plurality of word lines, each memory cell being connected to a corresponding sub-bit line pair and a corresponding word line;

selecting means for selecting one transistor pair out of said plurality of transistor pairs, and applying said selection signal to the selected transistor pair to render the transistor pair conductive; and means responsive to said test enable signal for selecting at least another transistor pair out of said plurality of transistor pairs, and applying said selection signal to the selected transistor pair to render the transistor pair conductive.

5. The semiconductor memory device according to claim 4, further comprising:

means responsive to said test enable signal for cutting off said selection signal to be applied to one transistor of the transistor pair selected by said selecting means, as well as selecting another transistor pair other than a transistor pair adjacent to the transistor pair selected by said selecting means out of said plurality of transistor pairs and applying said selection signal to one transistor of the selected transistor pair to render the transistor conductive.

6. The semiconductor memory device according to claim 4, further comprising:

a plurality of precharging means provided respectively corresponding to said plurality of sub-bit line pairs, each precharging means precharging a corresponding sub-bit line pair; and means responsive to said test enable signal for deactivating precharging means corresponding to a transistor pair to be selected by said selecting means.

7. A semiconductor memory device which can be subjected to an operation test in response to a prescribed test enable signal, comprising:

a main bit line pair;

a plurality of sub-bit line pairs provided corresponding to said main bit line pair;

a plurality of transistor pairs provided respectively corresponding to said plurality of sub-bit line pairs, each transistor pair being responsive to a prescribed selection signal for connecting one sub-bit line of a corresponding sub-bit line pair to one main bit line of said main bit line pair and connecting another sub-bit line pair thereof to another main bit line thereof;

a plurality of word lines located across said plurality of sub-bit line pairs;

a plurality of memory cells provided respectively corresponding to intersections of said plurality of sub-bit line pairs and said plurality of word lines, each memory cell being connected to a corresponding sub-bit line pair and a corresponding word line;

selecting means for selecting one transistor pair out of said plurality of transistor pairs, and applying said selection signal to the selected transistor pair to render the transistor pair conductive; and means responsive to said test enable signal for cutting off said selection signal to be applied to one transistor of the transistor pair selected by said selecting means, as well as selecting another transistor pair other than a transistor pair adjacent to the transistor pair selected by said selecting means out of said plurality of transistor pairs and applying said selection signal to one transistor of the selected transistor pair to render the transistor conductive.

8. A semiconductor memory device which can be subjected to an operation test in response to a prescribed test enable signal, comprising:

a main bit line pair;

a plurality of sub-bit line pairs provided corresponding to said main bit line pair;

a plurality of transistor pairs provided respectively corresponding to said plurality of sub-bit line pairs, each transistor pair being responsive to a prescribed selection signal for connecting one sub-bit line of a corresponding sub-bit line pair to one main bit line of said main bit line pair and connecting another sub-bit line thereof to another main bit line thereof;

a plurality of word lines located across said plurality of sub-bit line pairs;

a plurality of memory cells provided respectively corresponding to intersections of said plurality of sub-bit line pairs and said plurality of word lines, each memory cell being connected to a corresponding sub-bit line pair and a corresponding word line;

selecting means for selecting one transistor pair out of said plurality of transistor pairs, and applying said selection signal to the selected transistor pair to render the transistor pair conductive;

a plurality of precharging means provided respectively corresponding to said plurality of sub-bit line pairs, each precharging means precharging a corresponding sub-bit line pair; and means responsive to said test enable signal for deactivating precharging means corresponding to a transistor pair to be selected by said selecting means.

\* \* \* \* \*